(12) United States Patent
Fredriksson

(10) Patent No.: US 6,366,146 B2
(45) Date of Patent: Apr. 2, 2002

(54) PHASE-LOCKED LOOP BASED CLOCK PHASING IMPLEMENTING A VIRTUAL DELAY

(75) Inventor: Jesper Fredriksson, Uppsala (SE)

(73) Assignee: Telefonaktiebolaget L M Ericsson (publ) (SE)

( * ) Notice: Subject to any disclaimer, the term of this patent is extended or adjusted under 35 U.S.C. 154(b) by 0 days.

(21) Appl. No.: 09/815,984

(22) Filed: Mar. 23, 2001

(51) Int. Cl.$^7$ ................................................ H03L 7/00
(52) U.S. Cl. ...................... 327/156; 331/11; 331/22; 375/335; 327/145; 327/147
(58) Field of Search .................. 327/144, 145, 327/146, 147, 152, 155, 156; 331/9, 10, 11, 12, 31, 56; 375/334, 335, 337

(56) References Cited

U.S. PATENT DOCUMENTS

| | | | |
|---|---|---|---|
| 5,019,785 A | 5/1991 | Fognini et al. | 331/1 R |
| 5,339,278 A | 8/1994 | Irwin et al. | 331/16 |
| 5,574,757 A | 11/1996 | Ogawa | 375/376 |
| 5,596,300 A * | 1/1997 | Dietrich et al. | 331/17 |
| 5,638,410 A | 6/1997 | Kuddes | 375/357 |
| 5,648,964 A | 7/1997 | Inagaki et al. | 375/357 |

FOREIGN PATENT DOCUMENTS

| | | |
|---|---|---|
| EP | 0652642 A1 | 5/1995 |
| JP | 11008813 A | 1/1999 |

* cited by examiner

Primary Examiner—Timothy P. Callahan
Assistant Examiner—An T. Luu
(74) Attorney, Agent, or Firm—Burns, Doane, Swecker & Mathis, LLP

(57) ABSTRACT

The invention relates to reference handover in clock signal generation systems and similar applications. The idea according to the invention is to introduce a so-called "virtual" delay in the control loop of a PLL for the purpose of forcing the control loop to shift the phase of the PLL output clock signal, while still maintaining the mandatory phase lock condition of the PLL relative to a primary reference signal, towards a predetermined target phase relation with the primary reference signal. By utilizing a virtual delay, the problems associated with explicit delay elements such as passive or active delay lines are avoided, and a more robust and accurate clock phasing mechanism is obtained. Preferably, the virtual is introduced by superimposing an external phasing control signal in the control loop of the PLL on the output signal/input signal of a control loop element.

19 Claims, 5 Drawing Sheets

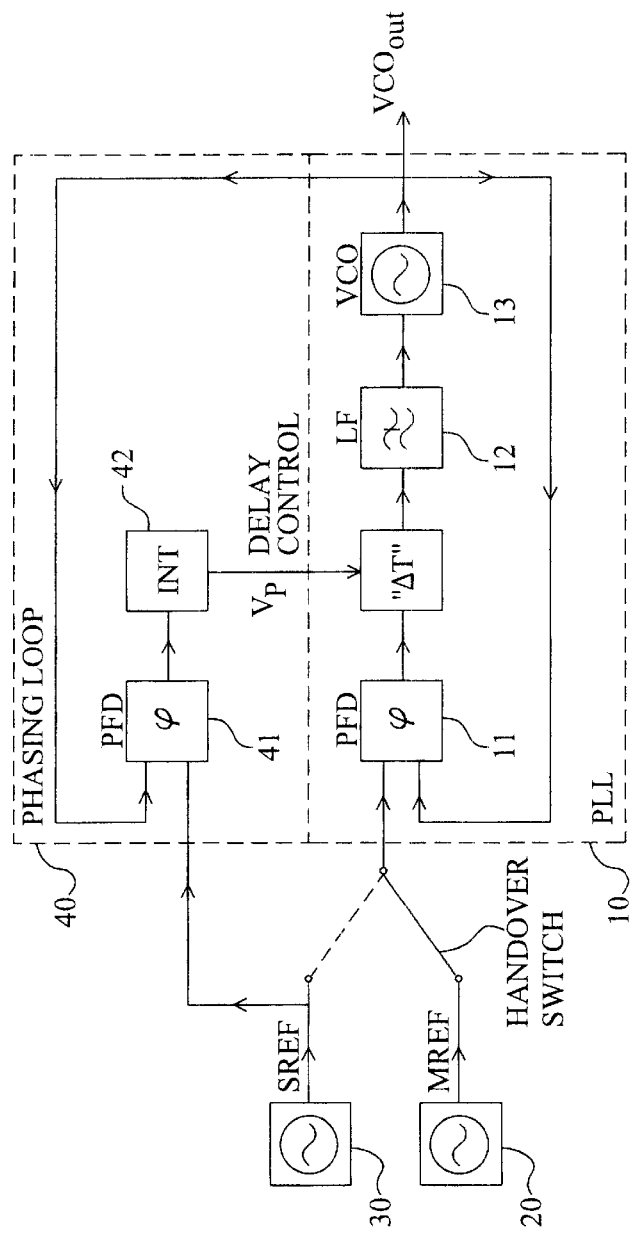
Fig. 1
Fig. 2A
Fig. 2B

PHASE-LOCKED LOOP BASED CLOCK PHASING IMPLEMENTING A VIRTUAL DELAY

TECHNICAL FIELD OF THE INVENTION

The present invention generally relates to clock signal generation, and in particular to clock generation and synchronization systems which require handover between multiple reference sources.

BACKGROUND OF THE INVENTION

Clock generation and synchronization systems are vital in many applications as they provide clock pulses required for synchronizing discrete and/or integrated circuits in many systems, such as telecommunication systems and other digital systems.

In many clock generation systems, a redundant architecture is utilized to meet the requirements on safety and reliability and to increase the mean time between system failure (MTBSF). Redundancy is normally ensured by using multiple clock modules that are interchangeable. With this arrangement, a faulty module can easily be switched out of operation while the remaining and still-functioning modules will maintain proper operation of the system.

In a typical application, a phase-locked loop (PLL) for clock signal generation operates towards a primary reference source, which provides the PLL with a primary reference clock signal. For increased reliability, the PLL has a number of standby reference sources to enable handover from the primary reference source to a standby reference source in case of malfunction such as clock loss or a degrading primary reference clock signal. However, when the operation is switched from one reference source to another and there is a phase difference between the reference clock signals of the two sources, a transient may be introduced into the system. Such a transient may propagate throughout the system so that at least portions of the overall system will be out of synchronization for a certain period of time, thus degrading the performance and reliability of the overall system. Naturally, it is desirable to reduce or eliminate any transients occurring when switching reference sources, and provide a seamless handover between different reference sources.

It is known to use delay elements arranged to compensate for the phase difference between different reference sources. However, delay lines, passive or active, generally have poor temperature and voltage variation stability, and variations in ambient temperature or supply voltage may thus introduce a significant undesirable phase drift. Integrating the delay element in an external control loop provide a better long term stability, but the jitter is increased and open loop conditions are still the same if the control process is terminated at some point. Active (silicon) delay lines generally experience a smallest step zero delay, and they also exhibit a finite accuracy or smallest incremental delay step due to control word size and atomic delay element properties, which in the end limit the tracking accuracy and give a lower bound for the jitter when the phase changes one step.

U.S. Pat. No. 5,638,410 discloses a system for aligning the phase of high-speed clocks in a telecommunication system. The system includes a phase detector for measuring the phase difference between the output signals from a primary stratum clock module and a standby stratum clock module. A microprocessor calculates the time needed to delay the standby clock signal enough to cancel the phase difference, and controls a digital delay line arranged for delaying the standby clock signal accordingly.

U.S. Pat. No. 5,648,964 discloses a master-slave multiplex communication system incorporating two communication devices, each with a data processing unit and a clock processing unit. The data processing unit of the first communication device receives a data signal, and the clock unit of the first device receives a clock in synchronism with the data signal as well as a clock from the second communication device. Correspondingly, the data processing unit of the second communication device receives a data signal, and the clock unit of the second device receives a clock in synchronism with the data signal as well as a clock from the first communication device. Each clock processing unit is configured with a delay circuit for delaying the clock received from the clock unit of the other communication device, a selection circuit for selecting one of the clock signals received by the clock unit, and a PLL for locking to the clock selected by the selection circuit and producing a synchronous clock of a frequency required for the data processing unit. In each communication device, the clock signal selected by the selection circuit of the corresponding clock unit is sent to the other communication device. The data signals from the two communication devices are fed together with their synchronous clocks to a multiplexer, in which the data signals are multiplexed and outputted. The delay circuits are provided for adjusting the phase of the selected clock signals so as to suppress phase variations occurring when the master-slave relationship between the communication devices is changed.

The Japanese Patent Abstract 11008813 A shows a phase locked loop (PLL) circuit arranged for suppressing noise that otherwise would appear on an LCD screen by superimposing a video signal on the control voltage that controls the VCO of the PLL circuit.

SUMMARY OF THE INVENTION

The present invention overcomes these and other drawbacks of the prior art arrangements.

It is a general object of the present invention to provide a robust and accurate clock phasing mechanism.

It is a particular object of the invention to provide a phase-locked loop (PLL) based system and method for clock signal generation, which makes it possible to shift the output clock phase of the PLL arbitrary while still maintaining phase lock to the PLL reference. In this respect, a typical application according to the invention would be to provide seamless handover between different reference sources.

These and other objects are met by the invention as defined by the accompanying patent claims.

The general idea according to the invention is to introduce a so-called "virtual" delay in the control loop of the PLL for the purpose of forcing the control loop to shift the phase of the PLL output clock signal, while still maintaining the mandatory phase lock condition of the PLL relative to a primary reference signal, towards a predetermined target phase relation with the primary reference signal.

The addition of an apparent delay, for example in the forward path of the control loop anywhere between the phase detector and the loop filter, forces the control mechanism of the PLL to compensate with a phase shift of equal magnitude but in opposite direction by displacing the output clock phase to maintain the mandatory phase lock condition. It is thus possible to shift the output clock phase of the PLL arbitrary, while maintaining a perfect phase lock to the current PLL reference.

For a typical application of the invention relating to a clock generation system implementing handover between a primary reference clock and a standby reference clock, the phase of the output clock of the PLL is normally shifted towards the phase of the standby reference clock, and when the target phase is reached, the reference clock for the PLL is switched from the primary reference to the standby reference. In this way, switching transients are eliminated and seamless handover is accomplished.

By utilizing a virtual delay, the problems associated with explicit delay elements such as passive or active delay lines are avoided, and a more robust and accurate clock phasing mechanism is obtained.

Preferably, the virtual delay is introduced by superimposing an external phasing control signal in the control loop of the PLL. From a practical point of view, it has turned out to be particularly advantageous to superimpose the phasing control signal on the output signal of the internal phase detector of the PLL.

For reference handover applications, the phasing control signal is normally provided by a phasing loop. The phasing loop has a significantly larger time constant than the control loop of the PLL so as to assure the mandatory phase lock condition of the PLL at all times.

A further advantage offered by the invention is that the virtual delay only depends on relative voltage references. The phase shift of the output clock signal is defined only by the ratio between the phasing voltage and the supply voltage of the PLL. From a control system point of view, such a strategy is superior to and more robust than an absolute value reference strategy.

The invention offers the following advantages:

Robust and accurate clock phasing mechanism;

Seamless handover between reference sources;

Well-defined output clock phase shift, since the virtual delay only depends on relative voltage references; and Reduced need for explicit delay elements.

Other advantages offered by the present invention will be appreciated upon reading of the below description of the embodiments of the invention.

BRIEF DESCRIPTION OF THE DRAWINGS

The invention, together with further objects and advantages thereof, will be best understood by reference to the following description taken together with the accompanying drawings, in which:

FIG. 1 is a schematic block diagram of a phase-locked loop based system for clock signal generation which implements handover between a master reference and a standby reference according to a preferred embodiment of the invention;

FIG. 2A is a schematic timing diagram illustrating an example of the phase relations between the master reference clock, the VCO output clock and the standby reference clock in a normal PLL configuration;

FIG. 2B illustrates the phase relations between the master reference clock, the VCO output clock and the standby reference clock when the PLL has reached its target steady state after the virtual delay based clock-phasing procedure according to the invention;

DETAILED DESCRIPTION OF EMBODIMENTS OF THE INVENTION

Figure 3:
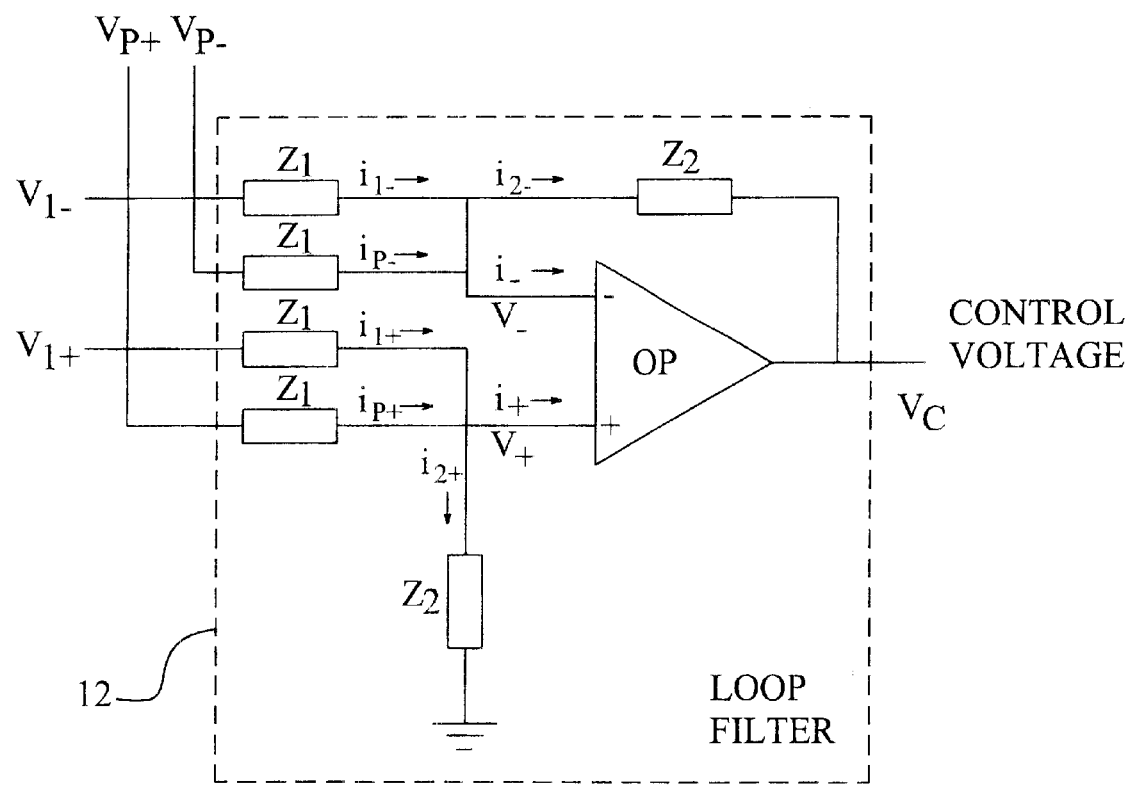
FIG. 3 is a circuit diagram of an active loop filter in a PLL-based clock signal generation system.

Throughout the drawings, the same reference characters will be used for corresponding or similar elements.

In a frequency synchronization or clock generation system, a central function is the ability to generate a clock signal with a predetermined arbitrary phase relation to a reference clock signal. For example, this function may be used to provide smooth handover between different reference sources for a phase-locked loop.

In general, a phase-locked loop is a circuit for synchronizing an output signal of the loop with an input reference signal in frequency as well as in phase. Throughout the disclosure, the term "phase-locked loop" should not be interpreted in a limited sense, but in the wide sense of a circuit that locks the phase of the generated output signal in a predetermined phase relation with an incoming reference signal. Thus, the term "phase-locked loop" includes any type of phase-locking or synchronizing circuitry such as the circuits commonly referred to by engineers as PLLs as well as delay-locked loops, so-called DLLs, when these loops are utilized for phase locking or synchronizing purposes.

FIG. 1 is a schematic block diagram of a phase-locked loop based system for clock signal generation implementing handover between a master reference and a standby reference according to a preferred embodiment of the invention. The system 1 comprises a phase-locked loop (PLL) 10, a master reference source 20, one or more standby reference sources 30, a handover switch, and a phasing loop 40 arranged in connection with the PLL.

In this particular example, the PLL 10 basically comprises a phase detector 11, also referred to as a phase frequency detector PFD, a loop filter LF 12 and an output clock signal source 13 such as a VCO. The phase detector 11 is responsive to the output signal of the VCO and an incoming reference clock signal MREF/SREF for providing a phase difference representing signal, and the loop filter 12 typically low-pass filters the phase difference representing signal to produce a corresponding control voltage for the VCO 13.

In the synchronized state, also referred to as the phase-locked state or steady state, there is a predefined mandatory phase relation between the VCO output clock signal and the input reference clock signal, and there is generally no frequency offset between the signals. However, if there is an instantaneous phase jump, or if a phase difference starts to build up, e.g. due to a frequency offset between the loop output signal and the reference signal, the phase-locked state is lost and the inherent control mechanism of the PLL strives to eliminate the frequency offset and find the phase-locked state again.

In normal operation, the master reference clock MREF is fed to the PLL 10 and the PLL is in a phase-locked state in which there is a mandatory phase relation, often determined by the particular implementation of the phase detector 11, between the VCO output clock and the master reference clock.

FIG. 2A is a schematic timing diagram illustrating an example of the phase relations between the master reference clock, the VCO output clock and the standby reference clock in a normal PLL configuration. In this case, the mandatory phase-lock condition of the PLL is a zero phase difference between the VCO output clock and the master reference clock MREF at the phase detector input.

However, if there is malfunction in the master reference source and the master reference clock degrades or, in worst case, is lost, the clock generation system has to make a handover to the standby reference source. The standby reference clock SREF is normally frequency coherent with the master reference clock MREF, but there may be a phase difference between the two reference clocks which may introduce a phase jump into the system and cause serious problems. This phase difference is illustrated as ΔT in FIG. 2A.

In order to reduce or eliminate any switching transients introduced by switching reference sources and provide seamless handover between the master reference and the standby reference, a phasing loop 40 with significantly larger time constant than the PLL itself is arranged in connection with the PLL to slowly shift the phase of the VCO output clock signal towards the phase of the standby reference clock. The edge displacement must be slow enough to satisfy the jitter and wander requirements imposed on the system level. The phasing loop 40 preferably has a phase detector 41 for measuring the phase difference between the VCO output clock and the standby reference clock, and a filter 42 such as an analog or digital integrator INT for generating a phasing control signal (DELAY CONTROL) in response to the measured phase difference. The phasing control signal is superimposed in the control loop of the PLL, preferably on the output signal of the phase detector/input signal to the loop filter of the PLL, to produce the same effect as the introduction of a delay in the control loop of the PLL, but without all the problems associated with explicit delay elements.

Addition of an apparent delay "ΔT" in the control loop forces the PLL to shift the phase of the VCO output clock, in order to maintain the phase lock condition of the PLL in relation to the master reference clock, by an amount equal to the introduced delay but in the opposite direction. This means that the phase of the VCO output clock will be slowly (because of the relatively large time constant of the phasing loop) shifted towards the phase of the standby reference clock.

FIG. 2B illustrates the phase relations between the master reference clock, the VCO output clock and the standby reference clock when the PLL has reached its target steady state after the virtual delay based clock-phasing procedure. As can be seen, the phase difference between the master reference MREF and the VCO output clock at the phase detector is now equal to −ΔT. However, this phase difference is compensated by the virtual delay of +ΔT, resulting in a zero net signal being fed to the loop filter 13. Thus, the VCO output clock will now remain unaltered in its new target steady state, which corresponds to a zero phase difference in relation to the standby reference clock SREF.

Now, when the VCO output clock is substantially in phase with the standby reference clock SREF, it is possible to make a smooth, and almost seamless handover from the master reference to the standby reference without introducing any switching transients into the system.

The virtual delay may be introduced in any suitable place in the control loop of the PLL, for example in the forward path of the loop anywhere between the phase detector and the loop filter as shown in FIG. 1. In the following, an illustrative example of how the phasing control signal is superimposed in the control loop of the PLL according to a preferred embodiment of the invention will be described with reference to FIG. 3.

FIG. 3 is a circuit diagram of pertinent parts of a PLL-based system for clock signal generation. The circuit diagram basically illustrates a differential implementation of the loop filter of the PLL with input and output interfaces. In this example, the loop filter 12 is based on an operational amplifier OP with associated capacitors/resistors Z. In addition to the differential input from the phase detector, the loop filter also receives the phasing control signal in the form of a phasing voltage $V_P$. The phasing voltage $V_P$ together with a second set of balanced resistors arranged in the active loop filter creates an offset current $I_P$ that is compensated by the control system as the oscillator phase is shifted relative to the reference clock at the phase detector input. The resulting compensating current is equal in magnitude but opposite in direction so that the loop filter has balanced phasing currents in steady state. In effect, the phasing voltage $V_P$ forms a static offset current superimposed on the phase detector output currents.

In steady-state, current summation to zero at the input side results in no net recharging of the loop filter and thus the oscillator frequency and phase remain constant despite the phase error deviation on the phase detector input. Assuming negligible input currents due to large (infinite in theory) amplification in the active filter gives the following relation:

$$\Delta V_i = V_+ - V_- \approx 0 \; V_+ \approx V_- \; i_+ \approx i_- \tag{1}$$

Applying Kirchoff's voltage node law for the non inverting input (+):

$$\frac{V_{1+} - V_+}{Z_1} + \frac{V_{P+} - V_+}{Z_1} = \frac{V_+}{Z_2} \tag{2}$$

$$V_+ = \frac{V_{1+} + V_{P+}}{2 + \frac{Z_1}{Z_2}}$$

Applying Kirchoff's voltage node law for the feedback path of the operational amplifier based filter:

$$\frac{V_{1-} - V_-}{Z_1} + \frac{V_{P-} - V_-}{Z_1} = \frac{V_- - V_C}{Z_2} \tag{3}$$

$$V_+ \approx V_- \Rightarrow V_{1-} + V_{P-} - \left(2 + \frac{Z_1}{Z_2}\right) V_+ = -\frac{Z_1}{Z_2} V_C$$

Using expression (2) for $V_+$, the filter output voltage $V_C$ as a function of differential input ($V_{1D} = V_{1+} - V_{1-}$) and phasing voltages ($V_{PD} = V_{P+} - V_{P-}$) is given by:

$$V_C = \frac{Z_2}{Z_1}(V_{1+} - V_{1-}) + \frac{Z_2}{Z_1}(V_{P+} - V_{P-}) \tag{4}$$

It can be seen that the filter output voltage is a linear superposition of the differential input voltage and the differential phasing voltage. At steady-state, the input and phasing voltages, and corresponding currents, are balanced.

To allow both positive and negative phase adjustment, the complementary part of the phasing voltage pair ($V_{P-}$) is often biased in the middle of the supply voltage interval ($V_{CC}/2$) with a noise decoupling capacitor attached between the pin and ground:

$$V_{P-} = \frac{V_{CC}}{2} \tag{5}$$

As mentioned above, a specific important application is to use the phasing voltage $V_P$ to adjust the oscillator clock phase relative a secondary reference clock such as a standby reference while maintaining phase and frequency lock to a primary reference clock.

Figure 4:
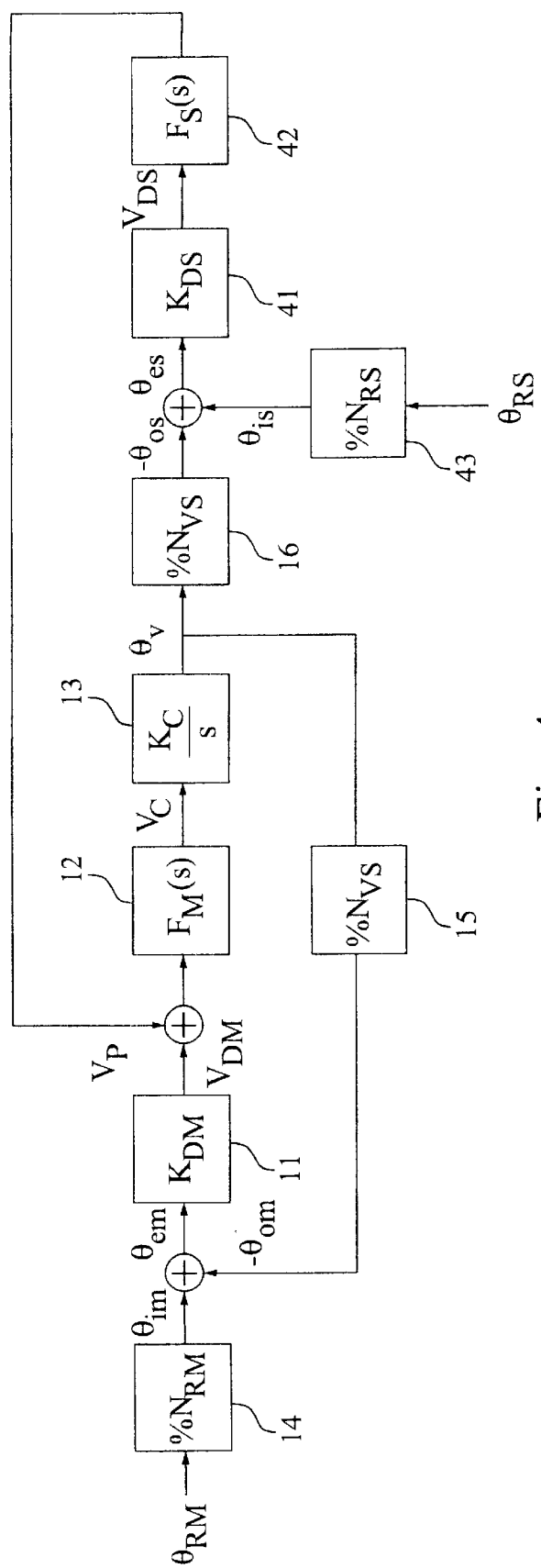
FIG. 4 illustrates a double control loop model of a clock phasing arrangement according to a preferred embodiment of the invention.

FIG. 4 illustrates a double control loop model of a clock phasing arrangement according to a preferred embodiment of the invention. In addition to the phase locked loop required to synchronize the oscillator to the master reference clock, here simply labeled RM, a phasing loop ensure the correct phase relation to the secondary or standby source clock, here simply labeled RS.

The ordinary PLL loop includes a phase detector 11, with linearized gain constant $K_{DM}$, an analog loop filter 12 with associated transfer function $F_M(s)$, and an output clock signal source 13. The voltage-to-frequency response of the clock signal source is characterized by the gain constant $K_C$, and the required conversion between phase and frequency has a transform of 1/s, where s is the integrator variable. For generality, the PLL is also associated with frequency dividers, a first divider 14, $N_{RM}$, for the primary reference clock and a second divider 15, $N_{VM}$, for the oscillator output clock to the feedback loop and a third divider 16, $N_{VS}$, for the oscillator output clock to the phasing loop.

Typically, the phasing control loop includes a phase detector 41, with linearized gain constant $K_{DS}$, and an analog or digital integrator filter 42, with associated transfer function $F_S(s)$, for generating the phasing voltage. The standby reference source RS is also associated with a frequency divider 43, $N_{RS}$.

It is important to recognize that the phasing filter is not normally an ordinary PLL loop filter, but rather a pure integrator function without the compensation zero commonly present in a PLL application. The double control loop system requires additional attention when selecting the time constants in the output clock generation and phasing sections in order to avoid false or no locking. A well-conditioned system is obtained if the phasing loop has a significantly larger time constant than the phase locked loop:

$$\tau_P \sim \frac{1}{R_i C_i} \gg \tau_M \sim \frac{1}{f_{BW}} \approx \frac{1}{2\zeta\omega_n} \quad (6)$$

For the phase locked loop alone (i.e. $V_P$ constant), the time constant $\tau_M$ depends on the reciprocal of the closed loop system bandwidth, which in turn is related to the damping ($\zeta$) and the natural angular frequency ($\omega_n$)

Figure 5:
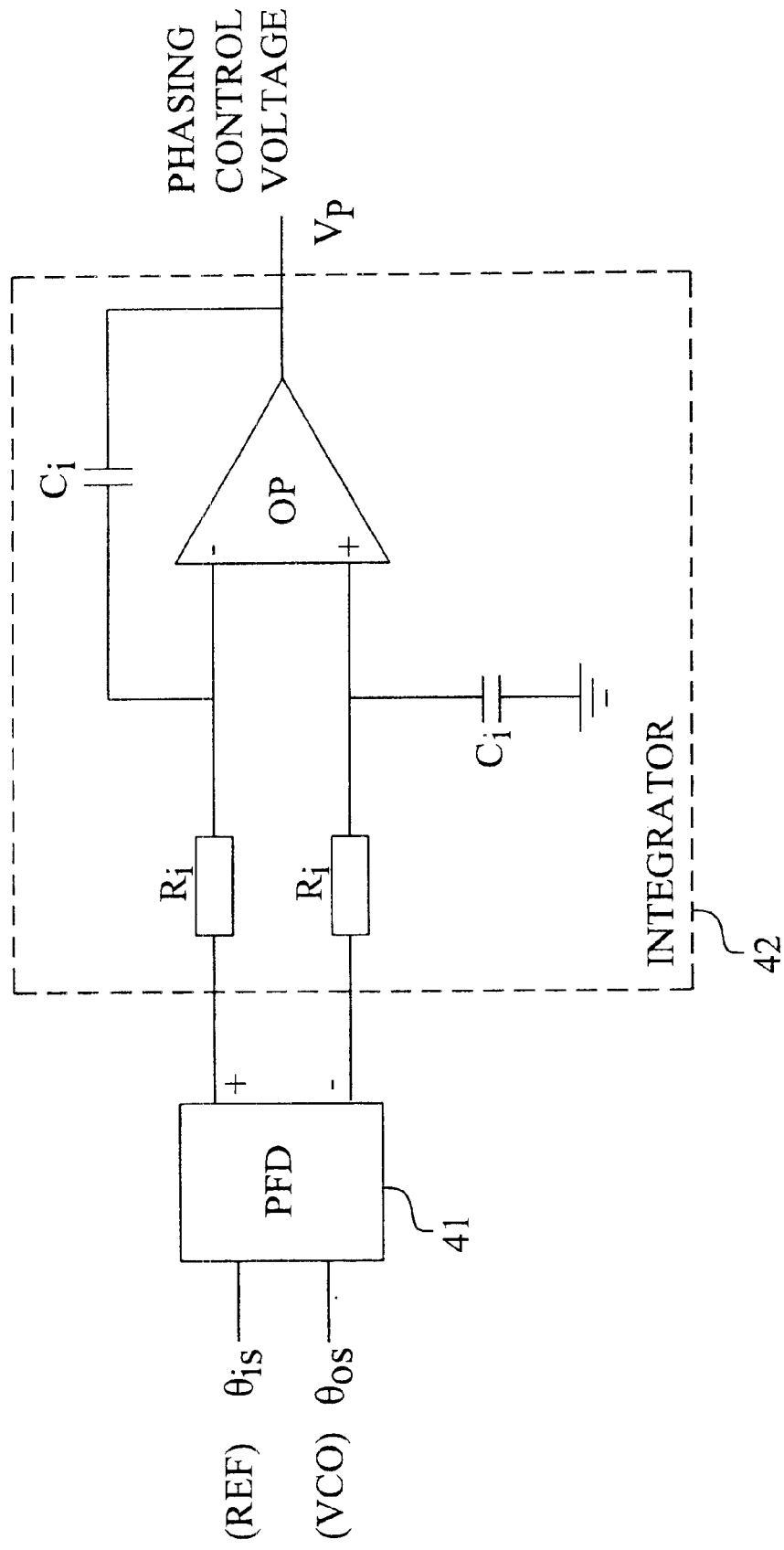
FIG. 5 is a circuit diagram of the integrator of the phasing loop implemented as an active analog filter.

For the phasing loop, the time constant $\tau_P$ depends on the integrator implementation. Implementing the integrator 42 of the phasing loop as an active analog filter, as illustrated in FIG. 5, gives a phasing time constant proportional to the integrator time constant $t_i=1/R_iC_i$.

The constitutive equation for the phase detector 41 of the phasing loop, linking the differential output voltage $V_{DS}$ to the phase error $\theta_{es}$ between the down scaled oscillator and standby reference clocks, is given by:

$$V_{DS}=K_{DS}\cdot(\theta_{is}-\theta_{os})=K_{DS}\cdot\theta_{es} \quad (7)$$

The voltage transfer function of the active integrator filter 42 of the phasing loop is given by:

$$\frac{V_P}{V_{DS}} = \frac{\frac{1}{sC_i}}{R_i} = \frac{1}{sR_iC_i} = \frac{1}{s\tau_i} = \frac{\omega_i}{s} \quad (8)$$

Again there is normally a difference between how the phase detector is used in cooperation with a frequency controlled element inside a PLL and in a phasing loop with an active integrator (the inverting and non inverting inputs of the operational amplifier are switched). In the case of an oscillator clock transition occurring before a reference clock transition, $\theta_{es}<0$, the phase of the oscillator clock is retarded by an increase of the phasing voltage, $V_P$. On the other hand, phase advance of the oscillator clock is achieved by lowering the phasing voltage to reduce the delay between reference and oscillator clock transitions, assuming that the reference clock branch is active in the phase frequency detector ($\theta_{es}>0$).

Figure 6:
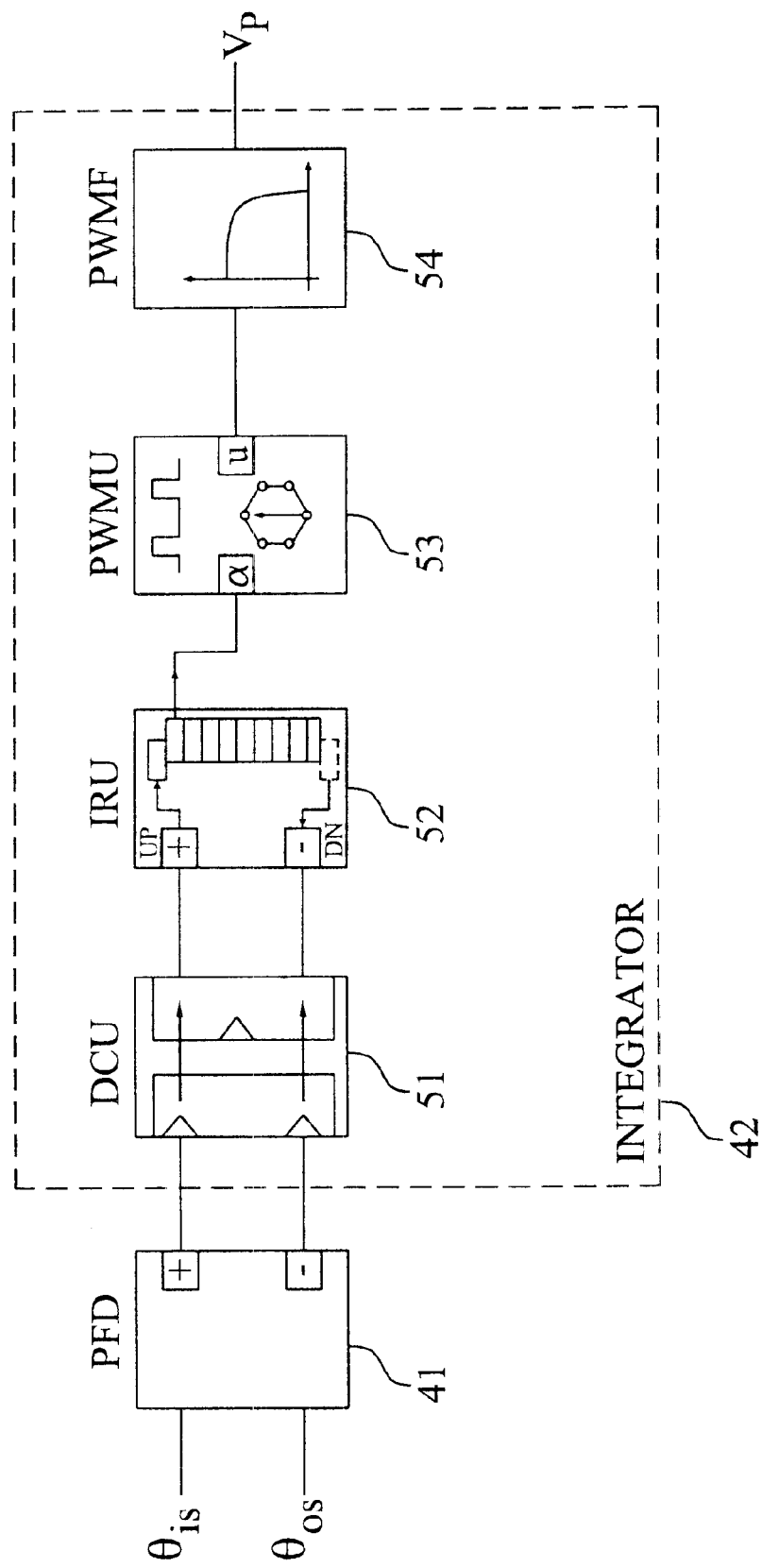
FIG. 6 is a block diagram of a digital integrator implementation using pulse width modulation.

Alternatively, the integrator 42 is based on a digital implementation as shown in FIG. 6. The digital integrator of FIG. 6 basically includes a phase detector decoding unit (DCU) 51, an integrator register unit (IRU) 52, a pulse width modulation unit (PWMU) 53 and a pulse width modulation filter (PWMF) 54.

Depending on whether the oscillator clock phase lead or lag relative to the primary reference, the integrator register 52, which is directly mapped to the phasing voltage, is incremented or decremented by the phase detector decoding unit 51, thus increasing or decreasing the delay of the oscillator transition.

In this example, the decoding unit DCU 51 captures and holds the phase detector output signals as well as calculates and translates the step up or step down control signal information between the various asynchronous clock systems. The phasing voltage may be formed by low pass filtering, in the PWMF unit 54, a pulse width modulation signal created in the PMWU unit 53 with a duty cycle ($\alpha$) that is pro-portional to the digital register word stored in the IRU 52. Not explicitly indicated in the block diagram is the sample clock ($T_S$) that updates the integrator register 52 and creates the pulse width modulation signal. Reduced ripple on the phasing voltage is achieved if the cut off frequency of the pulse width modulation filter 54 is well below the pulse width modulation rate and the filter has a large roll off. Below the 3 dB cut off frequency, the filter 54 should have a flat response without any jitter peaking, and the cut off frequency must be larger than the integrator time constant and the phasing loop bandwidth; preferably more than ten times larger.

In the following section, the closed loop control behavior is studied and in particular the relation between the phasing voltage and stationary oscillator phase shift is derived. The overall linear double control loop structure is shown in FIG. 4. Master (PLL) and slave (phasing) loops are addressed using index M and S, respectively.

The phase error between the primary reference clock and the oscillator clock, $\theta_{em}$, is given by:

$$\theta_{em} = \theta_{im} - \theta_{om} = \frac{\theta_{RM}}{N_{RM}} - \frac{\theta_V}{N_{VM}} \quad (9)$$

The oscillator control voltage $V_C$ from the loop filter having transfer function $F_M(S)$ is defined as:

$$V_C=F_M(S)\cdot[V_{DM}+V_P]=F_M(S)\cdot[K_{DM}\cdot\theta_{em}+V_P] \quad (10)$$

where $V_{DM}$ is the phase detector output voltage, which is directly proportional (gain constant $K_{DM}$) to the phase error $\theta_{em}$. Integration of the linear (slope $K_C$) frequency response to the control voltage $V_C$ gives the oscillator phase, $\theta_V$:

$$\theta_V = \frac{K_C}{s} \cdot V_C = \frac{K_C F_M(s)}{s} \cdot [K_{DM} \cdot \theta_{em} + V_P] \quad (11)$$

Similarly, the phase error $\theta_{es}$ between the secondary reference clock and the oscillator clock is given by:

$$\theta_{es} = \theta_{is} - \theta_{os} = \frac{\theta_{RS}}{N_{RS}} - \frac{\theta_V}{N_{VS}} \quad (12)$$

The integrator 42, $F_S(S)$, which is charged by the phase detector 41 of the phasing loop generates the phasing voltage $V_P$:

$$V_P = F_S(s) \cdot V_{DS} = F_S(s) \cdot K_{DS} \theta_{es} = F_S(s) \cdot K_{DS} \left[ \frac{\theta_{RS}}{N_{RS}} - \frac{\theta_V}{N_{VS}} \right] \quad (13)$$

Together, the expressions (11) and (13) for $\theta_V$ and $V_P$ give:

$$\theta_V = \frac{K_C K_{DM}}{s} \cdot F_M(s) \cdot \theta_{em} + \frac{K_C K_{DS}}{s} \cdot F_M(s) \cdot F_S(s) \cdot \theta_{es} \quad (14)$$

From expression (14) it can be seen that each loop gives a contribution to the oscillator phase $\theta_V$, namely the PLL part related to $\theta_{em}$ and the phasing part related to $\theta_{es}$. Using expression (9), the phase locked loop part $\theta_{VM}$ can be expressed as:

$$\theta_{VM} = \frac{K_C K_{DM}}{s N_{RM}} \cdot F_M(s) \cdot \theta_{RM} - \frac{K_C K_{DS}}{s N_{VM}} \cdot F_M(s) \cdot \theta_V \quad (15)$$

Treating the phasing part $\theta_{VS}$ in a similar manner using expression (12) gives:

$$\theta_{VS} = \frac{K_C K_{DS}}{s N_{RS}} \cdot F_M(s) \cdot F_S(s) \cdot \theta_{RS} - \frac{K_C K_{DS}}{s N_{VS}} \cdot F_M(s) \cdot F_S(s) \cdot \theta_V \quad (16)$$

The expression for the oscillator clock phase $\theta_V$ can be restructured as:

$$\theta_V = H_M(S) \cdot \theta_{RM} + H_S(S) \cdot \theta_{RS} \quad (17)$$

where the two closed loop phase transfer functions $H_M(S)$ and $H_S(S)$ for the master and slave loops are formed by the ratio of $\theta_V$, and $\theta_{RM}$ and $\theta_{RS}$, respectively:

$$H_M(s) = \frac{\frac{1}{N_{RM}} \cdot \frac{K_C K_{DM}}{s} \cdot F_M(s)}{1 + \frac{1}{N_{VM}} \cdot \frac{K_C K_{DM}}{s} \cdot F_M(s) + \frac{1}{N_{VS}} \cdot \frac{K_C K_{DM}}{s} \cdot F_M(s) \cdot F_S(s)} \quad (18)$$

$$H_S(s) = \frac{\frac{1}{N_{RS}} \cdot \frac{K_C K_{DS}}{s} \cdot F_M(s) \cdot F_S(s)}{1 + \frac{1}{N_{VM}} \cdot \frac{K_C K_{DM}}{s} \cdot F_M(s) + \frac{1}{N_{VS}} \cdot \frac{K_C K_{DM}}{s} \cdot F_M(s) \cdot F_S(s)} \quad (19)$$

A common special case is when both reference clocks have the same nominal frequency and the phase detectors are of the same type:

$$\begin{cases} f_{RM} = f_{RS} = f_R \\ K_{DM} = K_{DS} = K_D \end{cases} \Rightarrow \begin{cases} N_{VM} = N_{VS} = N_V \\ N_{RM} = N_{RS} = N_R \end{cases} \quad (20)$$

This simplifies the phase transfer functions $H_M(S)$ and $H_S(S)$:

$$H_M(s) = \frac{\frac{1}{N_R} \cdot \frac{K_C K_{DM}}{s} \cdot F_M(s)}{1 + \frac{1}{N_V} \cdot \frac{K_C K_{DM}}{s} \cdot F_M(s) \cdot [1 + F_S(s)]} \quad (21)$$

$$H_S(s) = \frac{\frac{1}{N_R} \cdot \frac{K_C K_{DM}}{s} \cdot F_M(s) \cdot F_S(s)}{1 + \frac{1}{N_V} \cdot \frac{K_C K_{DM}}{s} \cdot F_M(s) \cdot [1 + F_S(s)]} \quad (22)$$

For a well conditioned overall clock phasing system, the phasing loop present merely a small perturbation to the original phase locked loop phase transfer function $H_M(S)$. If the contribution from the integrator is small near critical points like the shear frequency, stability and performance analysis may be carried out on the unperturbed fully decoupled phase locked loop, i.e. at some $S=j\omega$ of interest:

$$1 + F_S(s) \approx 1 \Rightarrow H_M(s) = \frac{\frac{1}{N_R} \cdot \frac{K_C K_{DM}}{s} \cdot F_M(s)}{1 + \frac{1}{N_V} \cdot \frac{K_C K_{DM}}{s} \cdot F_M(s)} = H(s) \quad (23)$$

To examine the residual phase shift (offset) after a sufficiently long time has elapsed from the application of a constant step phase voltage $V_P(0)$ and reference clock phase $\theta_R(0)$ consider:

$$\theta_V = \frac{\frac{1}{N_{RM}} \cdot \frac{K_C K_{DM}}{s} \cdot F_M(s)}{1 + \frac{1}{N_{VM}} \cdot \frac{K_C K_{DM}}{s} \cdot F_M(s) \cdot \left[1 + \frac{N_{VM}}{N_{VS}} \cdot \frac{K_{DS}}{K_{DM}} \cdot F_S(s)\right]} \cdot \theta_R(s) + \frac{\frac{K_C}{s} \cdot F_M(s) \cdot F_S(s)}{1 + \frac{1}{N_{VM}} \cdot \frac{K_C K_{DM}}{s} \cdot F_M(s) \cdot \left[1 + \frac{N_{VM}}{N_{VS}} \cdot \frac{K_{DS}}{K_{DM}} \cdot F_S(s)\right]} \cdot V_P(s) \quad (24)$$

Laplace transforms of the applied step function:

$$\theta_R = \frac{\hat{\theta}_R}{s} \quad (25)$$

$$V_P = \frac{\hat{V}_P}{s}$$

The loop filter $F_M(S)$ in the phase locked loop is assumed to have one compensating zero and one pure integrator. Near DC the filters can thus be represented as:

$$F_M(s) \big|_{s \approx 0} \approx \frac{K_M}{s} \quad (26)$$

$$F_S(s) = \frac{K_i}{s}$$

The residual phase error or phase offset is given by the final value theorem:

$$\lim_{t\to\infty}\theta_V(t) = \lim_{s\to 0} s \cdot \theta_V(s) \quad (27)$$

In limit the following is true:

$$\lim_{s\to 0}\frac{\frac{K_1}{s^n}}{1+\frac{K_2}{s^n}} = \frac{K_1}{K_2}\bigg|_{n>0} \quad (28)$$

So the output frequency offset from the ideal zero position is given by:

$$\lim_{t\to\infty}\theta_V(t) = \hat{\theta}_R + \frac{\hat{V}_p}{K_{DS}}\cdot N_{VS} \quad (29)$$

For a three state phase frequency detector, the gain constant $K_{DS}$ is given by:

$$K_{DS} = \frac{V_{CC}}{2\pi} \Rightarrow \theta_{VS}(t) \to 2\pi \cdot \frac{\hat{V}_p}{V_{CC}}\cdot N_{VS} \quad (30)$$

Consequently, the oscillator phase shift $\theta_{VS}$ due to the applied phasing voltage $V_P$ is simply a fraction of the period equivalent to the ratio between the applied phasing voltage and the maximum phase detector voltage level. It can thus be seen that the phase offset only depends on relative voltage references, and from a control system point of view, such a strategy is superior to and more robust than an absolute value reference strategy.

Although the reference handover problem has been described in relation to a single PLL where the output clock signal is aligned with a standby reference clock, it is should be understood that other handover applications are feasible as well. In particular, there may be handover applications that involve a whole set of phase-locked loops, one for each reference clock present in the system, and where the handover takes place between a master PLL and a standby PLL. For example, the output clocks of the standby phase-locked loops may be aligned by means of the mechanism proposed by the invention to a selected master reference clock, or even to an imaginary target phase which may be a fixed phase that does not belong to any of the physical clocks present in the system. In the latter case, phase drift due to repeated master changes and the associated phasing operations can be avoided. The target phase may be chosen to be the average over all working reference clocks. Depending on the particular implementation, the active master clock may or may not also be phased. Jitter and wander aspects sometimes prohibit phasing of an active output clock. Cycle to cycle edge displacement must small enough to fulfil jitter and wander requirements that are applicable on the system level. Ultimately such requirements impose an upper bound on the integrator time constant in the phasing loop.

It should also be understood that the invention is not limited to reference handover applications, and that the clock phasing mechanism according to the invention is generally applicable for shifting the phase of the VCO output clock to any predetermined target phase relation with the primary reference clock of the PLL. For example, a fixed DC voltage can be generated and applied to the PLL and superimposed in the control loop to obtain a phase relation between the PLL reference and the VCO output other than the characteristic phase relation (0°, 90°, . . . ) given by the particular phase detector implementation.

Although, the phasing control voltage has been described as generated through an integrator function, it should be understood that various alternatives are open for the skilled person.

The embodiments described above are merely given as examples, and it should be understood that the present invention is not limited thereto. Further modifications, changes and improvements which retain the basic underlying principles disclosed and claimed herein are within the scope and spirit of the invention.

What is claimed is:

1. A phase-locked loop (PLL) based system for clock signal generation, comprising a phasing loop having:
   means for generating a phasing control signal in response to an output/down-scaled clock signal of the PLL and a secondary reference clock signal; and
   means for superimposing said phasing control signal in a control loop of the PLL for forcing the control loop to shift a phase of the PLL output clock signal, while still substantially maintaining a mandatory phase lock condition of the PLL in relation to a primary reference clock signal, towards a phase of said secondary reference clock signal,
   said phasing loop having a significantly larger time constant than the control loop of the PLL.

2. The phase-locked loop based system according to claim 1, wherein said phasing control signal is superimposed on an output signal of a control loop component of the PLL.

3. The phase-locked loop based system according to claim 1, wherein said phasing control signal is a phasing voltage, and the output clock signal phase shift is defined only by a ratio of said phasing voltage and a supply voltage to said PLL.

4. The phase-locked loop based system according to claim 1, wherein said phasing loop includes:
   a phase detector for measuring a phase difference between the output/down-scaled clock signal of the PLL and the secondary reference clock signal; and
   an integrator responsive to said phase difference for generating said phasing control signal.

5. The phase-locked loop based system according to claim 4, wherein said phasing control signal is superimposed on an output signal of an internal phase detector of the PLL.

6. The phase-locked loop based system according to claim 5, wherein said phasing control signal is a phasing voltage, and said superimposing means includes means for forming of said phasing voltage a static offset current superimposed on the phase detector output currents.

7. The phase-locked loop based system according to claim 6, wherein a common supply voltage is provided for a loop filter of the PLL and the internal phase detector of said PLL, as well as for the integrator of said phasing loop, and the output clock signal phase shift is defined only by the ratio of said phasing voltage and said supply voltage.

8. A method of generating a clock signal by a phase-locked loop, said method comprising the steps of:
   generating a phasing control signal by a phasing loop arranged in connection with the PLL and having a significantly larger time constant than the control loop of the PLL; and
   superimposing said phasing control signal in a control loop of the PLL for forcing the control loop to shift a phase of the PLL output clock signal, while still maintaining a mandatory phase lock condition of the PLL in relation to a primary reference clock signal, towards a phase of a secondary reference clock signal.

9. The clock signal generation method according to claim 8, wherein said phasing control signal is generated by:
   measuring a phase difference between the output/down-scaled clock signal of the PLL and the secondary reference clock signal;
   integrating said phase difference by an integrator in said phasing loop to generate the phasing control signal.

10. The clock signal generation method according to claim 9, wherein said phasing control signal is superimposed on an output signal of an internal phase detector of the PLL.

11. The clock signal generation method according to claim 10, wherein said phasing control signal is a phasing voltage, and said superimposing step includes the step of forming of said phasing voltage a static offset current superimposed on the phase detector output currents.

12. The clock signal generation method according to claim 11, wherein said phasing control signal is a phasing voltage, and the oscillator phase shift is defined only by a ratio of said phasing voltage and a supply voltage to said PLL.

13. The clock signal generation method according to claim 12, further comprising the step of providing a common supply voltage for a loop filter of the PLL and the internal phase detector of said PLL, as well as for the integrator of said phasing loop.

14. A clock generation system implementing handover between a primary reference clock signal and a standby reference clock signal, wherein said system comprises:
   a phase-locked loop (PLL) responsive to said primary reference clock signal for generating an output clock signal;
   a phasing loop having a significantly larger time constant than a control loop of the PLL, and including:
      a phase detector for measuring a phase difference between the output/down-scaled clock signal of the PLL and said standby reference clock signal;
      a filter circuit responsive to said phase difference for generating a phasing control signal; and
      means for superimposing said phasing control signal in the control loop of the PLL for forcing the control loop to shift a phase of the PLL output clock signal, while still maintaining a mandatory phase lock condition of the PLL in relation to said primary reference clock signal, towards the phase of said standby reference clock signal.

15. The clock generation system according to claim 14, further comprising means for switching the reference clock signal of the PLL from said primary reference clock signal to said standby reference clock signal when the PLL output clock signal is substantially in phase with said standby reference clock signal.

16. The clock generation system according to claim 14, wherein said phasing control signal is superimposed on at least one of the output signal and input signal of a control loop component of the PLL.

17. The clock generation system according to claim 14, wherein said phasing control signal is superimposed on an output signal of the internal phase detector of the PLL.

18. The clock generation system according to claim 14, wherein said phasing control signal is a phasing voltage, and the output clock signal phase shift is defined only by a ratio of said phasing voltage and a supply voltage to the PLL.

19. A phase-locked loop (PLL) based system for clock signal generation, comprising:
   means for generating a fixed DC voltage; and
   means for superimposing said fixed DC voltage in a control loop of the PLL for forcing the control loop to shift a phase of the PLL output clock signal, while still substantially maintaining a mandatory phase lock condition of the PLL in relation to a reference clock signal, to a predetermined target phase relation with said primary reference clock signal,
   thereby obtaining a phase relation between the reference clock signal and the PLL output clock signal other than the characteristic phase relation.

* * * * *

UNITED STATES PATENT AND TRADEMARK OFFICE
CERTIFICATE OF CORRECTION

PATENT NO.    : 6,366,146 B2
DATED         : April 2, 2002
INVENTOR(S)   : Jesper Fredriksson It is certified that error appears in the above-identified patent and that said Letters Patent is hereby corrected as shown below:

<u>Title page,</u>
Please insert the following: Related Application information should show that this application claims priority from Swedish Application No. 0001029-8, dated March 23, 2000. -- [30] Foreign Application Priority Data
       Mar. 23, 2000    (SE)    Sweden ………………….. 0001029-8 --

Signed and Sealed this

Eighth Day of October, 2002

*Attest:*

*Attesting Officer*

JAMES E. ROGAN
*Director of the United States Patent and Trademark Office*